United States Patent
Pienta et al.

(10) Patent No.: US 9,546,795 B2
(45) Date of Patent: *Jan. 17, 2017

(54) ARRANGEMENT FOR MANAGING DATA CENTER OPERATIONS TO INCREASE COOLING EFFICIENCY

(71) Applicant: Siemens Industry, Inc., Alpharetta, GA (US)

(72) Inventors: William Thomas Pienta, Prospect Heights, IL (US); Pornsak Songkakul, Mequon, WI (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 309 days.

This patent is subject to a terminal disclaimer.

(21) Appl. No.: 14/304,710

(22) Filed: Jun. 13, 2014

(65) Prior Publication Data

US 2014/0297043 A1 Oct. 2, 2014

Related U.S. Application Data

(63) Continuation of application No. 12/435,401, filed on May 4, 2009, now Pat. No. 8,782,234.

(Continued)

(51) Int. Cl.
*G06F 15/173* (2006.01)
*F24F 11/00* (2006.01)
(Continued)

(52) U.S. Cl.
CPC ........... *F24F 11/0009* (2013.01); *G06F 1/206* (2013.01); *G06F 1/329* (2013.01); *G06F 9/505* (2013.01);
(Continued)

(58) Field of Classification Search
CPC ........ G06F 1/206; G06F 1/329; G06F 9/5027; G06F 9/505; H05K 7/20836; Y02B 60/1275; Y02B 60/144; Y02B 60/146; Y02B 60/14
(Continued)

(56) References Cited

U.S. PATENT DOCUMENTS 6,487,457 B1 * 11/2002 Hull ........................ G05B 15/02
700/17
6,879,881 B1 * 4/2005 Attridge, Jr. .......... F24F 3/0442
165/217

(Continued)

OTHER PUBLICATIONS

Hikita et al.,"Saving 200kW and $200 K/year by power-aware job/machine scheduling", Parallel and Distributed Processing, 2008, IPDPS 2008. IEEE International Symposium, pp. 1-8, Apr. 14, 2008, 8 pages.

(Continued)

*Primary Examiner* — Tauqir Hussain

(57) ABSTRACT

A method includes a step of storing in a memory efficiency characteristic information for each of a plurality of air conditioning units in a location containing a plurality of server computers, the efficiency characteristic information including information representative of an efficiency performance curve for a range of variable cooling output. The method also includes identifying a current thermal load on each of the plurality air conditioning units. The method further includes employing the stored efficiency characteristic information and the current thermal load to identify a first air conditioning unit having a least additional power consumption required to increase cooling output. One or more processing units are employed to allocate one or more processing tasks to one of the plurality of server computers based on the identified first air conditioning unit.

20 Claims, 5 Drawing Sheets

Related U.S. Application Data

(60) Provisional application No. 61/050,425, filed on May 5, 2008, provisional application No. 61/050,429, filed on May 5, 2008, provisional application No. 61/050,420, filed on May 5, 2008.

(51) Int. Cl.
| | |
|---|---|
| G06F 1/20 | (2006.01) |
| G06F 1/32 | (2006.01) |
| G06F 9/50 | (2006.01) |
| H05K 7/20 | (2006.01) |
| H04L 29/08 | (2006.01) |

(52) U.S. Cl.
CPC ......... G06F 9/5027 (2013.01); H04L 67/1029 (2013.01); H05K 7/20836 (2013.01); *Y02B 60/1275* (2013.01); *Y02B 60/142* (2013.01); *Y02B 60/144* (2013.01); *Y02B 60/146* (2013.01); *Y02B 60/148* (2013.01)

(58) Field of Classification Search
USPC ........................................................ 709/224
See application file for complete search history.

(56) References Cited

U.S. PATENT DOCUMENTS

| | | | | |
|---|---|---|---|---|
| 7,455,103 | B2 * | 11/2008 | Sato | G06F 1/206 |
| | | | | 165/104.31 |
| 7,472,558 | B1 | 1/2009 | Narita | |
| 2001/0048030 | A1 * | 12/2001 | Sharood | G05B 19/00 |
| | | | | 236/49.3 |
| 2002/0000092 | A1 * | 1/2002 | Sharood | F25D 29/00 |
| | | | | 62/127 |
| 2003/0193777 | A1 | 10/2003 | Friedrich et al. | |
| 2004/0020224 | A1 | 2/2004 | Bash et al. | |
| 2005/0055590 | A1 | 3/2005 | Farkas et al. | |
| 2005/0228618 | A1 | 10/2005 | Patel et al. | |
| 2006/0161307 | A1 | 7/2006 | Patel et al. | |
| 2008/0288193 | A1 | 11/2008 | Claassen et al. | |
| 2009/0157333 | A1 | 6/2009 | Corrado et al. | |
| 2009/0268404 | A1 * | 10/2009 | Chu | H05K 7/20836 |
| | | | | 361/696 |

OTHER PUBLICATIONS

Bash et al., "Cool Job Allocation: Measuring the Power Savings of Placing Jobs at Cooling-Efficient Locations in the Data Center", (XP-002547236); 2007 USENIX Annual Technical Conference, Jun. 17-22, 2007, Santa Clara, CA, pp. 0-9, Retrieved from the internet—URL: www.hpl.hp.com/techreports/2007/HPL-2007-62. html> Figures 1-7.

Moore et al., Weatherman: Automated, Online, and Predictive Thermal Mapping and Management for Data Centers (XP-31016274); Published by Autonomic Computing, ICAD '06, IEEE Internation Conference, Jan. 1, 2006, pp. 155-164, 10 pages.

* cited by examiner

US 9,546,795 B2

ARRANGEMENT FOR MANAGING DATA CENTER OPERATIONS TO INCREASE COOLING EFFICIENCY

This application is a continuation of U.S. patent application Ser. No. 12/435,401, filed May 4, 2009, which claims the benefit of U.S. Provisional Application Ser. No. 61/050,425 filed May 5, 2008, U.S. Provisional Application Ser. No. 61/050,429, filed May 5, 2008, and U.S. Provisional Application Ser. No. 61/050,420, filed May 5, 2008, all of which are incorporated herein by reference.

CROSS-REFERENCE TO RELATED APPLICATIONS

This application is related to U.S. Pat. No. 8,260,928, filed May 4, 2009, which is incorporate herein by reference.

FIELD OF THE INVENTION

The present invention relates generally to data processing centers, and more particularly, to the management of the operations of a data processing center.

BACKGROUND OF THE INVENTION

Data centers are parts of buildings or facilities in which a large number of server computers are located. The dense packing of the server computers results in the generation of a large amount of heat in a localized area. The data center must be cooled in a reliable manner in order to avoid the shutting down of, or damage to, the server computer hardware. Shutting down of server computers due to heat overload can cause significant economic loss.

Accordingly, specialized cooling units have been developed for implementation directly in data centers. These specialized cooling units are sometimes known in the art as computer room air conditioning units ("CRACs") or computer room air handling units. In this disclosure, air conditioning unit or CRAC will be understood to encompass any device used to effect cooling in a data center. CRACs have been employed as a result of the fact that the ordinary HVAC systems of buildings are not optimally configured to handle the concentrated head generated with data centers. Thus, CRACs are often used in connection with, but in addition to, the ordinary cooling units of a building employed for human comfort systems.

Many CRACs have simple, embedded controls that adjust the unit output based on factors such as sensed ambient air temperature. In some cases, CRACs have controllers that interact with the building automation system that controls or includes the building HVAC system, among other things.

While CRACs provide a solution to the need for enhanced cooling power within a data center having several server computers, the power consumed by CRACs is significant. It is therefore desirable to reduce the power consumption associated with the adequate cooling of data centers.

SUMMARY

The present invention addresses the above identified needs, as well as others, by providing a method and arrangement that allocates processing tasks to servers based on the location of the servers with respect to air conditioning units. Moreover, embodiments of the invention allocate processing tasks to servers based on efficiency characteristics of air conditioning units within the data center. As a result, heat generated by the execution of processing tasks is advantageously distributed to the air conditioning units based on their efficiencies.

A first embodiment is a method that includes a step of obtaining efficiency characteristic information for each of a plurality of air conditioning units in a location containing a plurality of server computers. The method also includes employing one or more processing units to allocate one or more processing tasks to one of the plurality server computers based on the efficiency characteristic information.

In some embodiments, a first processing request is allocated to a first of the plurality of computers based on a thermal proximity of the first of the plurality of computers to a select one of the plurality of air conditioning units. In addition, the select one of the plurality of air conditioning units is selected based on the efficiency characteristic information.

A second embodiment is an arrangement that includes a computer server management system having a memory and processing circuit. The processing circuit is configured to coordinate the usage of a plurality of server computers. The memory stores efficiency characteristic information for a plurality of air conditioning units in a location containing a plurality of server computers. The processing circuit is further configured to allocate one or more processing tasks to one of the plurality of server computers based on the efficiency characteristic information.

The above described features and advantages, will become more readily apparent to those of ordinary skill in the art by reference to the following detailed description and accompanying drawings.

DETAILED DESCRIPTION

Figure 1:
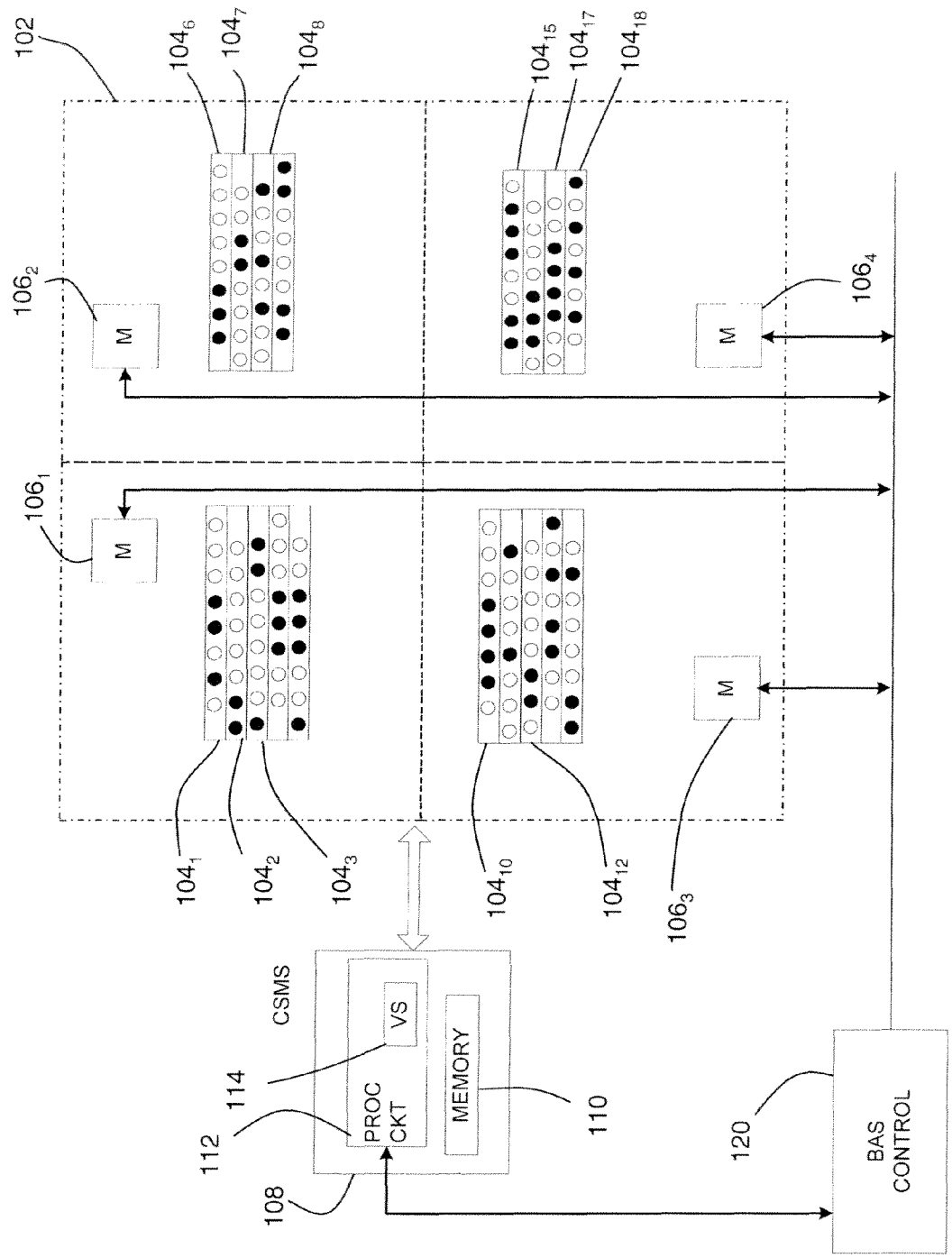
FIG. 1 shows a schematic block diagram of an exemplary arrangement according to a first embodiment of the invention implemented to coordinate application processing in an exemplary data center.

FIG. 1 shows an arrangement 100 according to an exemplary embodiment of the invention. The arrangement 100 is shown used in conjunction with a data center 102 that includes a plurality of server computers $104_1, 104_2 \ldots 104_{18}$ and a plurality of air conditioning units $106_1, 106_2, 106_3,$ and $106_4$. The arrangement 100 includes a computer server management system 108 having, among other things, a memory 110 and a processing circuit 112. In this embodiment, the arrangement 100 further includes a BAS element 120, which is communicatively connected to the processing circuit 112.

Each of the server computers $104_1$ to $104_{18}$ is part of a set of computers that provide application processing services to at least one, and typically a large number of, client computers, not shown. The server computers $104_1$ to $104_{18}$ are typically arranged in racks and dispersed throughout the space of the data center 102. For example, as shown in FIG.

1, the server computers $104_1$, $104_2$, $104_3$, $104_4$, and $104_5$ may be grouped on a first rack, the server computers $104_6$, $104_7$, $104_8$, and $104_9$ may be grouped on a second rack, the server computers $104_{10}$, $104_{11}$, $104_{12}$, $104_{13}$, and $104_{14}$ may be grouped on a third rack, and the server computers $104_{15}$, $104_{16}$, $104_{17}$, and $104_{18}$ may be grouped on a fourth rack.

Each of the air conditioning units $106_1$, $106_2$, $106_3$, and $106_4$, is a computer room air conditioner or computer room air handler unit, collectively referred to as CRACs, or any air conditioning unit that may suitably be employed to specifically cool a data center or other area that is a high heat generator, and requires significant localized cooling. Such devices are well known in the art. In this embodiment, each of the air conditioning units (ACUs) $106_1$, $106_2$, $106_3$, and $106_4$ is operably coupled to the BAS element 120 such that the BAS element 120 can perform at least some measure of control over the operations of the ACUs $106_n$. For example, if an ACU $106_n$ has self-contained temperature sensing and control, the BAS element 120 may be operably connected to override the on/off local control, and/or to provide a set point to the ACU $106_n$. Other ACUs may be configured for more extensive control by an external field controller of the building automation system. In either event, the BAS element 120 preferably is operably connected to provide overall management and/or control of the each of the ACUs $106_1$, $106_2$, $106_3$, and $106_4$.

The BAS element 120 is one or more devices that are configured to communicate with, and operate within, a building automation system such as an HVAC system or the like. Such systems are known in the art and may have a general architecture of the APOGEE™ system available from Siemens Building Technologies Inc. The BAS element 120 includes at least one processing circuit 140 and a memory 142. The BAS element 120 may suitably take the form of a supervisory work station in a BAS such as the INSIGHT™ work station available from Siemens Building Technologies, Inc., of Buffalo Grove, Ill. In the alternative, the BAS element 120 may suitably be a configurable field controller, such as the PXC Modular field controller, also available from Siemens Building Technologies, Inc. In general, the processing circuit 140 is configured via other circuits to communicate BAS data (such as set points, sensor values, and commands) with other BAS devices such as other controllers, or even with sensors and actuators. The BAS element 120 may further includes special digital or analog I/O devices as may be necessary to communicate with control elements of the ACUs $106_1$, $106_2$, $106_3$, and $106_4$. In this embodiment, the BAS element 120 is further operably connected to communicate information with the computer server management system 108, and particularly the processing circuit 112. To this end, a suitable data interface is provided between the BAS element 120, which is configured for a BAS system, and the computer server management system 108, which is typically not set up for communication with a BAS system.

The computer server management system 108 is a computing system that is generally configured to coordinate the usage of the plurality of server computers $104_1$, $104_2$. Such devices are generally known. To coordinate the server usage, the processing circuit 112 of the computer server management system 108 executes virtualization software 114. Virtualization software 114, as is known in the art, is software that, when executed by a computer processor, manages the allocation of application processes among a plurality of server computers, such as in a data center.

In accordance with this embodiment of the present invention, the processing circuit 112 is further configured to allocate application processes among the server computers $104_1$, $104_2$, etc. based on the efficiency characteristics of the ACUs $106_1$, $106_2$, $106_3$, $106_4$. As will be discussed below in detail, the processing circuit 112 allocates applications processes among the server computers $104_1$ to $104_{18}$ such that the resultant heat generated by the processing of the applications is distributed among the ACUs $106_1$, $106_2$, $106_3$, $106_4$ in a manner that takes into account the relative efficiencies of the units for different thermal load levels.

Figure 2:
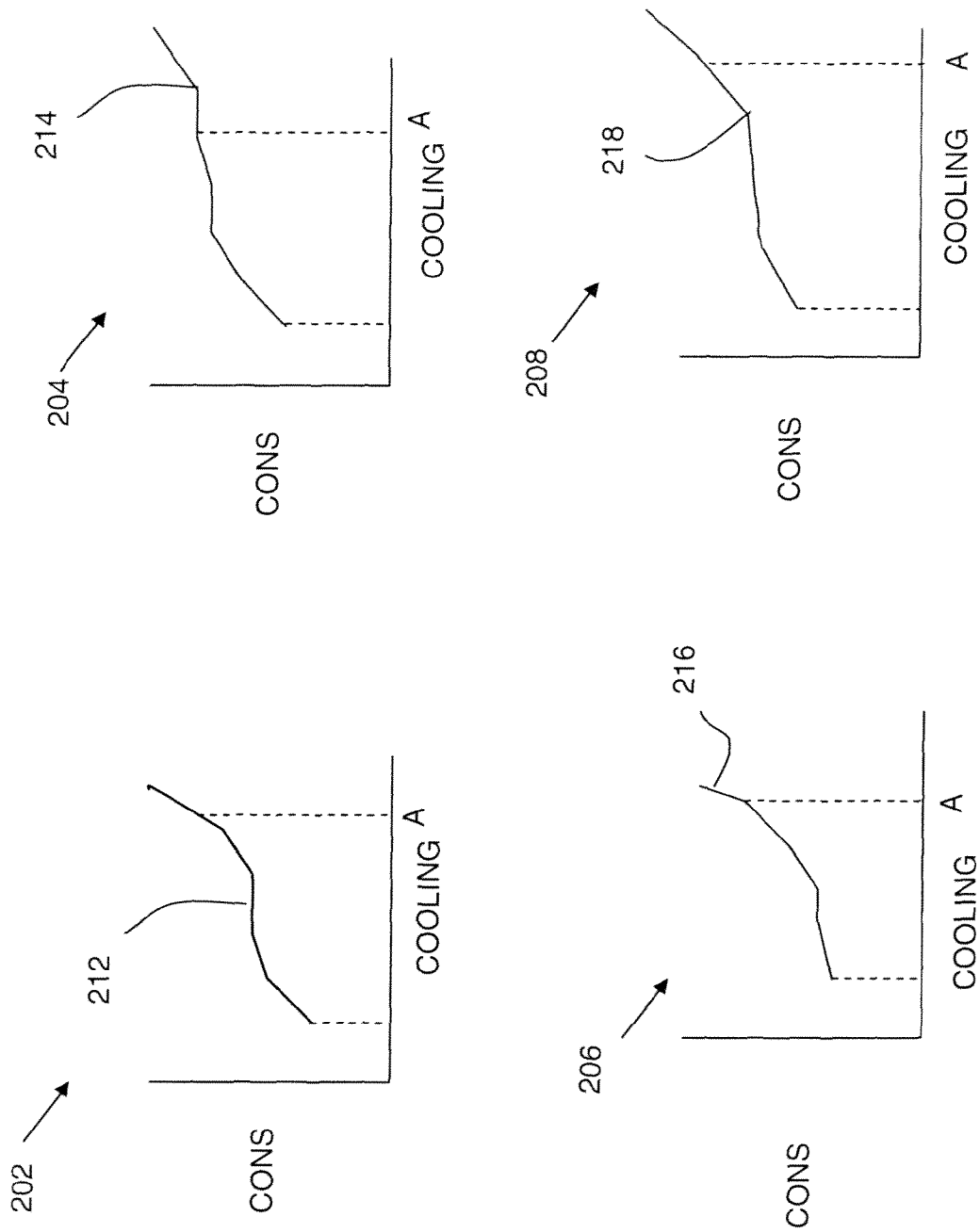
FIG. 2 shows a set of exemplary efficiency characteristic curves for air conditioning units in the data center shown in FIG. 1.

To this end, the memory 110 stores efficiency characteristic information for the plurality of ACUs $106_1$, $106_2$, $106_3$, $106_4$ in the data center 102. The efficiency characteristic information may suitably comprise part-load performance curves for each of the ACUs $106_1$, $106_2$, $106_3$, $106_4$. For example, FIG. 2 shows exemplary graphs 202, 204, 206 and 208, each graph showing efficiency curves 212, 214, 216 and 218 for various loads. The x-axis as represents the cooling output, and the y-axis represents the power consumption.

The efficiency curves 212, 214, 216 and 218 may be generated in a plurality of ways, some depending on the type of air conditioning unit. In general, the curves may be generated by identifying the power consumption for a plurality of cooling output values. The curves 212, 214, 216 and 218 may be generated from the resultant data points via interpolation or curve-fitting techniques.

To obtain the data points, the cooling output is generally measured as the change in air temperature ($\Delta T$) between the input and output of the ACU, multiplied by the air flow through the unit. The associated power consumption can be measured in various ways depending on the type of unit. If the unit is entirely self-contained (e.g. contains a compressor and refrigerant), the electrical power consumption of the ACU provides a good measure of the power consumption. If, however, the device relies on coolant provided and/or pumped from another source, such as chilled water, then the power consumption can be measured as the flow of coolant multiplied by the change in temperature of the coolant between the input and output of the ACU. The electrical power consumption of the unit's fan must also be added. Obviously, this measure of power consumption can be made more accurate by taking into account coolant transmission loss to and from the ACU, as well as other losses.

In any event, after various data points of cooling output versus power consumption are be obtained for each air-conditioning unit $106_1$, $106_2$, $106_3$, $106_4$, the efficiency curves 212, 214, 216, and 218 are generated using straight-line interpolation or curve-fitting may be used. In any event, data representative of the curves 212, 214, 216 or 218 is stored in the memory 110.

Referring again to FIG. 1, as discussed above, the computer server management system 108 is configured to allocate (via the virtualization software) one or more processing tasks to one of the plurality computer servers $104_1$-$104_{18}$ based in part on the efficiency characteristic information of the air-conditioning units $106_1$, $106_2$, $106_3$, $106_4$. In a first exemplary operation, applications are directed to computer servers $104_n$, $104_o$, etc. based on the thermal proximity of the servers $104_n$, $104_o$, etc. to the air-conditioning units $106_1$ to $106_4$ and the stored efficiency characteristics of the air-conditioning units $106_1$ to $106_4$.

It will be understood that the phrase "thermal proximity" as used herein means an extent to which two items are thermally coupled, e.g. how much heat is transferable between them. For example, if a computer server is adjacent to the input of an ACU such that the unit receives and removes all of the heat generated by the computer server, then they are closely thermally coupled, and thus have a high degree of "thermal proximity". While thermal proximity is often a result of physical proximity, it is possible for a server computer to be physically proximate to, but not very tightly thermally coupled to, a particular ACU. Relative thermal proximity between cooling devices such as ACUs and heat generating equipment in an environment such as a data center may readily be determined or at least estimated by those of ordinary skill in the art.

In any event, when an application is assigned to a server computer $104_n$, the execution of the application causes that server computer $104_n$ generate heat energy. The processing circuit 112 allocates the processing tasks such that the heat generated by the server computers 104 executing the processing tasks is distributed efficiently among the various ACUs $106_1$, $106_2$, $106_3$ and $106_4$.

By way of example, consider a situation in which 100 applications must be allocated to the server computers $104_1$ to $104_{18}$. In the prior art, one way to allocate the applications may be to simply allocate a substantially an equal number of applications to each of the processors, such that in this example each of the server computers $104_1$ to $104_{18}$ would have five or six of the one hundred applications. Alternatively, the allocation may be based on attempting to keep the busy-ness of each of the server computers $104_1$ to $104_{18}$ roughly equal. Thus, if a particular server computer $104_n$ has a number of particularly computationally intensive tasks, it may have fewer overall applications. The computing speed and efficiency of the server computers $104_1$ to $104_{18}$ may also be taken into account. In either event, the prior art method can include more or less equal distribution of processing load among the server computers.

However, it may be the case that such an allocation does not result in efficient use of the ACUs $106_1$, $106_2$, $106_3$, $106_4$. To this end, assume that the ACU $106_1$ generally is responsible for cooling (i.e. is thermally proximate to) the server computers $104_1$ to $104_5$, the ACU $106_2$ generally is responsible for cooling the server computers $104_6$ to $104_9$, the ACU $106_3$ generally is responsible for cooling the server computers $104_{10}$ to $104_{14}$, and the ACU $106_4$ generally is responsible for cooling the server computers $104_{15}$ to $104_{18}$. It may be the case that with the heat loading cause by a more or less equal allocation of applications among the processors $104_1$ to $104_{18}$ does not result in the ACUs $106_1$, $106_2$, $106_3$, $106_4$ operating at their most efficient levels possible. Indeed, even assuming that the heat generated by server computers $104_1$ to $104_{18}$ is equally distributed among the ACUs $106_1$, $106_2$, $106_3$, $106_4$, the ACUs $106_1$, $106_2$, $106_3$, $106_4$ as a group may not be operating at their highest efficiency levels. In particular, each ACU $106_n$ may have a different level at which they operate most efficiently, and may be more or less efficient that other units at various output levels. This is evidenced by the variability of the curves 212, 214, 216 and 218. Thus, in accordance with the present invention, the processing circuit 112 assigns the applications to the server computers $104_1$ to $104_{18}$ such that the heat is allocated in accordance with the combined efficient operating levels of the ACUs $106_1$, $106_2$, $106_3$, $106_4$.

In a simple illustration, assume that at a certain average thermal load level, the first ACU $106_1$ may be operating at a much more efficient level than the second ACU $106_2$ another. In such a case, it might be advantageous to place more processing load on the server computers $104_1$ to $104_5$ because they are more thermally proximate to the more efficient first ACU $106_1$, and place less processing load on server computers $104_6$ to $104_9$ because they are more thermally proximate to the less efficient ACU $106_2$. However, at the same time, placing too much of the processing load on processors thermally proximate to the first ACU $106_1$ and too little on the server computers thermally proximate to the second ACU $106_2$ may also result in reduced efficiency. The processing circuit 112 thus uses efficiency information such as the curves 212, 214, 216 and 218 to distribute the heat load to the ACUs $106_1$, $106_2$, $106_3$, $106_4$ in an efficient manner. The heat load is distributed to a particular ACU $106_m$ by assigning processing tasks to server computers $104_n$ that are thermally proximate to (i.e. tightly thermally coupled to) that ACU $106_m$.

The processing circuit 112 is therefore configured to determine the allocation of at least some processes based on the efficiency characteristics of the four ACUs $106_1$, $106_2$, $106_3$, $106_4$. In general, such a determination is further dependent upon the thermally proximity of the server computers $104_1$ to $104_{18}$ to the ACUs $106_1$, $106_2$, $106_3$, $106_4$.

Figure 3:
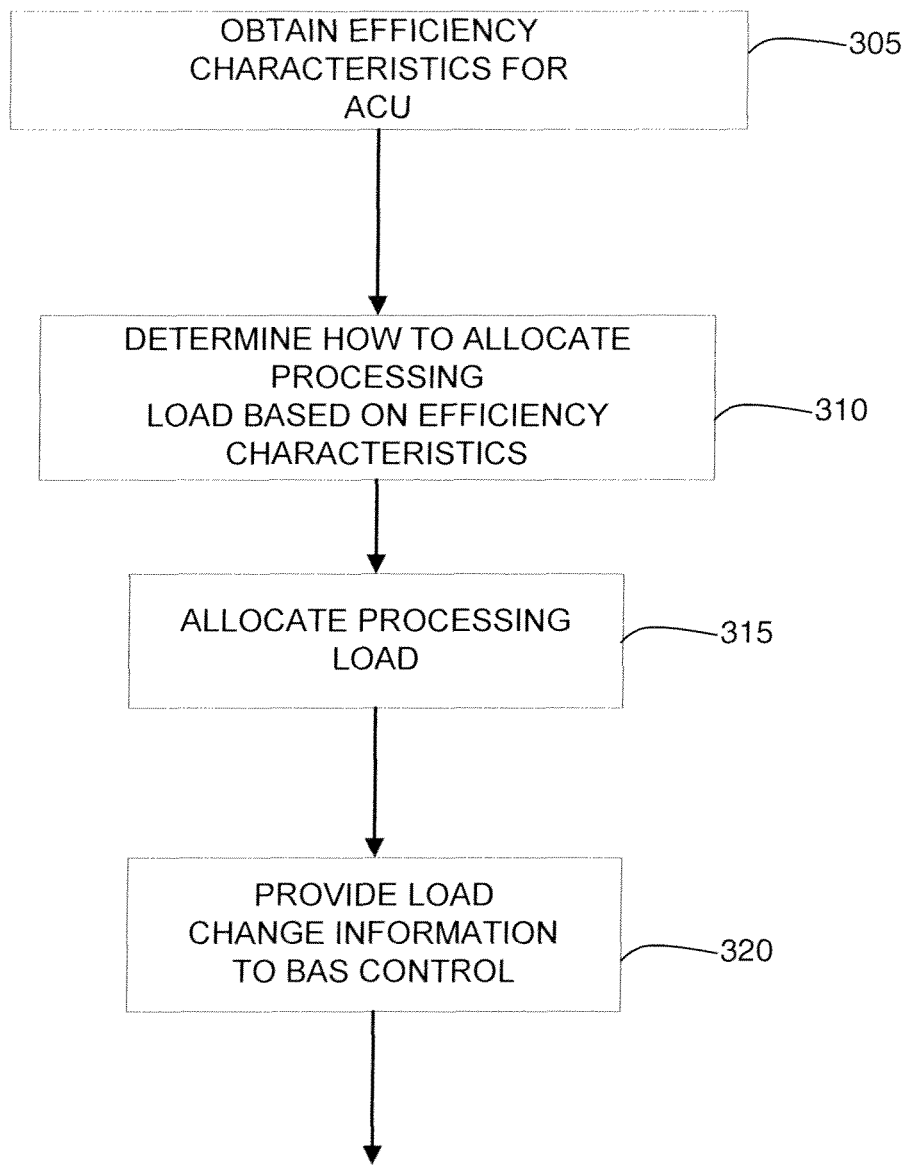
FIG. 3 shows an exemplary set of operations that may be carried in accordance with the present invention.

FIG. 3 shows an exemplary embodiment of the general operations of the processing circuit 112 of FIG. 1. In step 305, the processing circuit 112 obtains efficiency characteristics for the ACUs $106_1$, $106_2$, $106_3$, $106_4$. As discussed above, the efficiency characteristics may suitably comprise the part-load curves 212, 214, 216 and 218 of cooling output as a function of energy consumption, as illustrated in the graphs 202, 204, 206 and 208 of FIG. 2. Typically, the processing circuit 112 obtains this information via communications, or by user input, as a result of a set-up procedure for the data center 102. The processing circuit 112 stores the efficiency information in the memory 110. In some embodiments, the efficiency characteristics of the ACUs $106_1$, $106_2$, $106_3$, $106_4$ may be stored in a memory of the BAS element 120, or another computer.

In step 310, the processing circuit 112 determines how to allocate the processing load based on the efficiency characteristics of the ACUs $106_1$, $106_2$, $106_3$, $106_4$. To this end, the processing circuit 112 also has information that correlates the server computers $104_1$ to $104_{18}$ to the ACUs $106_1$, $106_2$, $106_3$, $106_4$. For example, each server computer $104_n$ is identified as having a thermally closest ACU $106_m$. By thermally closest, it is meant that the heat load generated by the server computer $104_n$ is borne primarily by that ACU $106_m$, or in other words, the server computer $104_n$ is most thermally proximate to the ACU $106_m$.

In a more sophisticated embodiment, each server computer $104_n$ may have a thermal impact function that consists of a weighted polynomial, wherein each term represents the thermal load bearing capacity of one of the ACUs $106_1$, $106_2$, $106_3$, $106_4$. This embodiment acknowledges that the heat load generated by a server computer $104_n$ may in some cases be handled, at least in part, but more than one of the ACUs $106_1$, $106_2$, $106_3$, $106_4$. Such a thermal impact function for a server computer $104_n$ would be expressed as:

$$H_{total,n} = I_{1061,n} H_{total,n} + I_{1062,n} H_{total,n} + I_{1063,n} H_{total,n} + I_{1064,n} H_{total,n}$$

wherein $I_{1061,n}$, $I_{1062,n}$, $I_{1063,n}$, $I_{1064,n}$ are weighting factors totaling 1, and $H_{total,n}$ is the total heat generated by the server computer $104_n$. The weighting factors represent the proportion of heat generated by the server computer $104_n$ that is loaded on to each of the ACUs $106_1$, $106_2$, $106_3$, $106_4$. For example, the server computer $104_{15}$ may have weighting factors $I_{1061,15} = 0.02$; $I_{1062,15} = 0.12$; $I_{1063,15} = 0.01$; and $I_{1064,15} = 0.85$, while the server computer $104_{12}$ may have weighting factors $I_{1061,12} = 0.02$; $I_{1062,12} = 0.00$; $I_{1063,12} = 0.9$; and $I_{1064,12} = 0.08$.

The processing circuit 112 then uses the computer server-ACU correlation information to distribute the processing tasks such that the heat load will cause the mix of ACUs $106_1$, $106_2$, $106_3$, and $106_4$ to be operating at a collectively best (or very good) efficiency load levels.

In a very simple example of step 310, the processing circuit 112 may execute an algorithm that starts with a first proposed task allocation, estimates the heat generated thereby, and then identifies the load on the conditioning units $106_1$, $106_2$, $106_3$, and $106_4$ using the server/ACU thermal proximity correlation information. Once the load on the ACUs $106_1$, $106_2$, $106_3$, and $106_4$ is estimated, the processing circuit 112 uses the stored efficiency information (e.g. curves 212, 214, 216 and 218) to calculate the overall efficiency (or power consumption value) for the first proposed task allocation. Thereafter, the processing circuit 112 generates a second proposed task allocation that is slightly (or significantly) different from the first proposed task allocation. The processing circuit 112 uses the same procedure to determine the overall efficiency of the second proposed task allocation. The processing circuit 112 repeats this process for additional proposed task allocations. The processing circuit 112 may also use any number of converging algorithms to solve for a best (or very good) proposed task allocation based on the overall efficiencies of the various proposed task allocations.

However, it will be appreciated that the allocation of tasks to achieve efficient heat loading of the ACUs $106_1$, $106_2$, $106_3$, and $106_4$ may be carried out in other ways. Some other ways are discussed below in connection with FIGS. 4 and 5.

Referring again to FIG. 3, once the processing circuit 112 determines the allocation of computing tasks in step 310, the processing circuit 112 in step 315 causes the allocation of the processing tasks in accordance with the determination. The operations of step 315 may be carried out using the known capabilities of computer server management systems. After step 315, the computer servers $104_1$ to $104_{18}$ may suitably execute the processing task that has been assigned to them.

In an optional step 320, the processing circuit 112 further communicates load information to the BAS control 120. The load information either identifies the overall processing load on the servers $104_1$ to $104_{18}$, any change in load on the servers $104_1$ to $104_{18}$, or any estimate of thermal load on the ACUs $106_1$, $106_2$, $106_3$, and $106_4$. The BAS control 120 in some cases may use this information to make proactive decisions on thermal cooling, or to control aspects of the ACUs $106_1$, $106_2$, $106_3$, and $106_4$ to accommodate any needed increase or decrease in cooling output.

Figure 4:
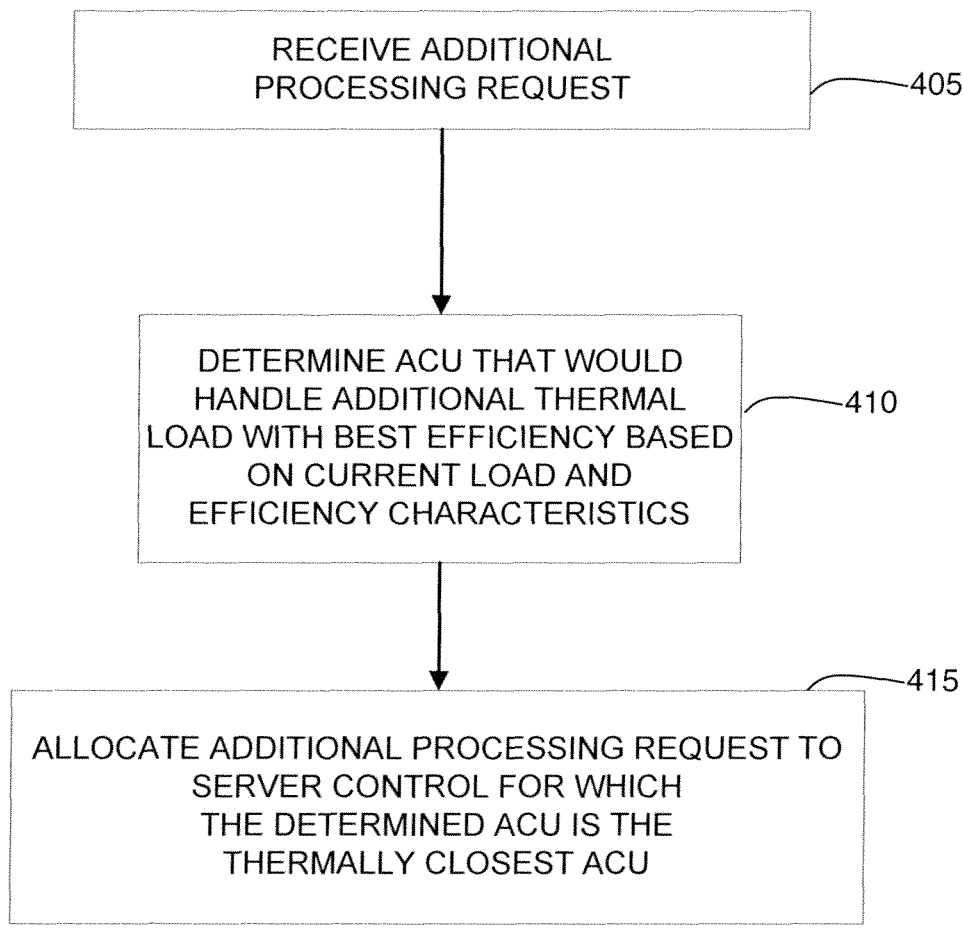
FIG. 4 shows in further detail an exemplary embodiment of at least one of the operations of FIG. 3.

FIG. 4 shows on example of the processing task allocation determination that may be used as step 310 in FIG. 3. The operations of FIG. 4 describe a processing task allocation determination that occurs incrementally during ongoing operation of the data center. More specifically, the operations of FIG. 4 may be used when new task or a new set of processing tasks are requested of the server computers $104_1$ to $104_{18}$. While the operations of FIG. 4 are described with respect to a single additional application or processing request, it will be appreciated that the steps of FIG. 4 may suitably be used with a group of additional processing requests.

In some cases, the processing circuit 112 can proactively determine where the next n applications should be assigned before the requests are actually received.

In step 405, the processing circuit 112 of the computer server management system 108 receives an additional processing request. To this end, from time to time, client computers that access the data center 102 provide requests for application tasks to be executed by one or more of the computer servers $104_1$ to $104_{18}$. Assuming that the additional processing request is non-trivial in nature, the processing circuit 112 proceeds to step 410 to determine an allocation for the task.

In step 410, the processing circuit 112 determines which of the ACUs $106_m$ would handle additional heat load with the best efficiency. Such a determination may be carried out by identifying the current thermal load on each of the ACUs $106_1$, $106_2$, $106_3$, $106_4$, and using the efficiency characteristics to identify the ACU $106_m$ that would require the least amount of incremental additional power consumption to provide the additional cooling.

For example, referring to FIG. 2, assume that an existing heat loading on the $106_1$, $106_2$, $106_3$, $106_4$, is shown as point A on each of the graphs 202, 204, 206 and 208. It can be seen that slope increases as a function of inefficiency in the curves 212, 214, 216 and 218. In other words, the slope increases because more power is required to achieve incremental gains in cooling. Assuming a current thermal loading as indicated by points A in the graphs 202, 204, 206 and 208, the processing circuit 112 in step 410 of FIG. 4 would determine that the ACU $106_2$ would handle the additional heat load resulting from additional processing best, compared to the ACUs $106_1$, $106_3$, and $106_4$. The processing circuit 112 would make that determination because the slope of the curve 214 at point A is the minimum among those of curves 212, 214, 216 and 218.

Referring again to FIG. 4, after step 410, the processing circuit 112 executes step 415. In step 415, the processing circuit 112 causes the additional processing task to be allocated or assigned to one the server computers that is thermally proximate to (i.e. is cooled most by) the ACU $106_m$ that was identified in step 410. In the exemplary operation of step 410 discussed above in connection with FIG. 2, the processing circuit 112 in step 415 would cause assignment of the additional task to one of the server computers (e.g. servers $104_6$ to $104_9$) that is thermally proximate or thermally closest to the ACU $106_2$.

As discussed above, the processing circuit 112 may perform step 410 (and step 415) proactively, in anticipation of new request. In such a case, the result of steps 410 and 415 is to identify where the next n processing tasks will be assigned once they are received. The processing circuit 112 stores the generated information and assigns incoming processing task requests accordingly.

In general, the processing task assignment operation of FIG. 4, which is based on incremental efficiency, can result in adding new tasks in an energy efficient manner. However, the operations of FIG. 4 may not result in the overall best efficiency. For example, the operations of FIG. 4 do not necessary account for terminated processing tasks in a way that maximizes efficiency. Terminated tasks can reduce the thermal load in the data center. While the reduced thermal load due to termination of tasks is at least taken into account in step 410 (by considering the current thermal loading of the ACUs $106_1$, $106_2$, $106_3$, $106_4$), the current state of the thermal loading on the ACUs $106_1$, $106_2$, $106_3$, $106_4$ can be inefficient. The inefficiency can be due to the fact that terminations of tasks can drastically alter the thermal loading in ways that the mere incremental assignment of additional tasks cannot adequately compensate.

In addition, the operations of FIG. 4 presume that all (or at least a given set) of ACUs are currently on, and can be variably loaded to achieve an optimum result. In many cases, however, operation of less than all of the ACUs may be sufficient to handle the thermal load. The intelligent selection of which ACUs should be activated to handle certain levels of load can increase energy consumption efficiency.

Figure 5:
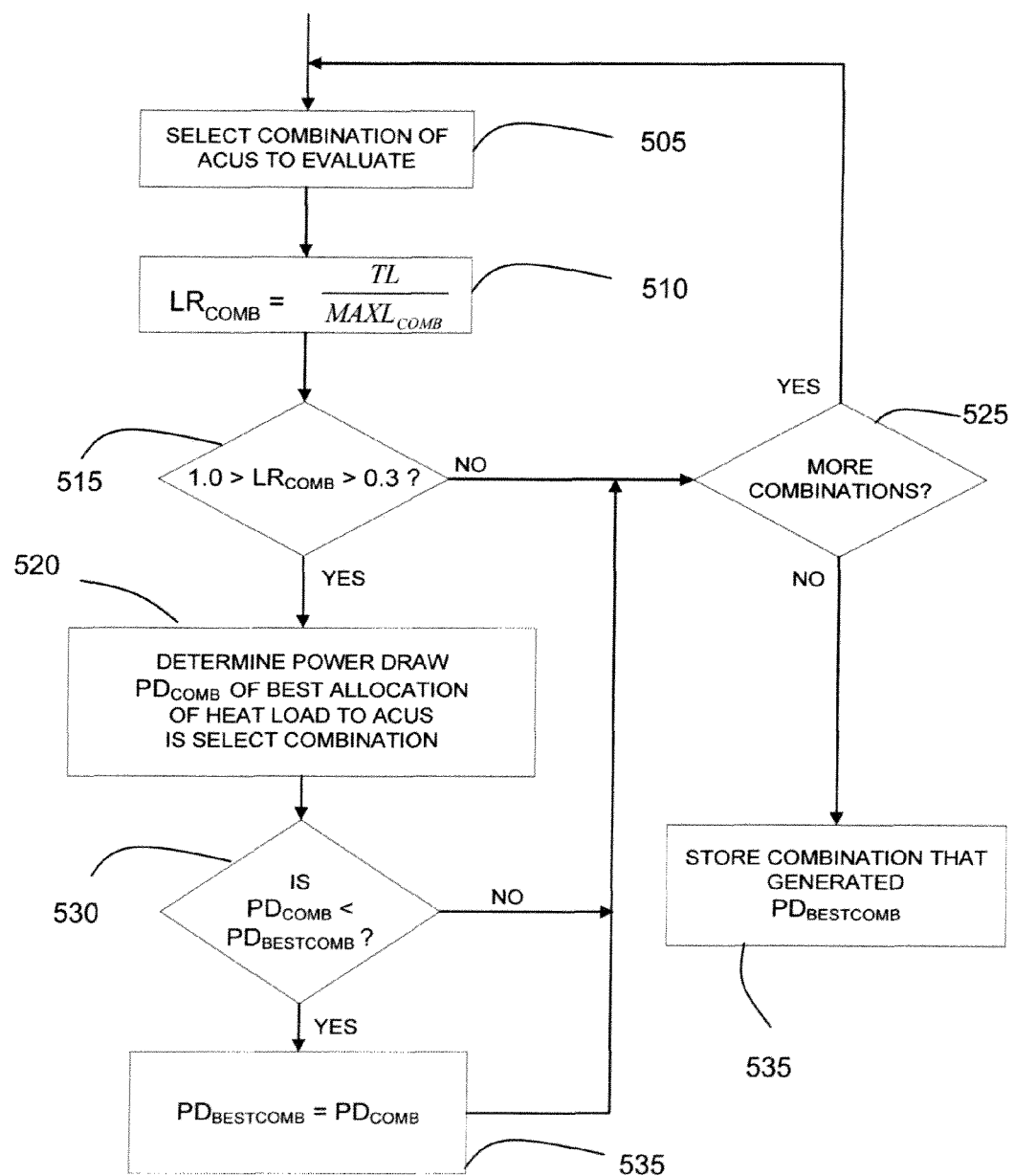
FIG. 5 shows in further detail a second embodiment of at least one of the operations of FIG. 3.

To address the issues regarding the operations of FIG. 4, FIG. 5 shows a set of operations that may be used to allocate and/or reallocate existing application tasks to achieve thermal cooling efficiency. To this end, the operations of FIG. 5 determine which of the ACUs $106_1$, $106_2$, $106_3$, $106_4$ should be activated for various overall thermal load levels in the data center 102. Once a best or near best ACU configuration is determined, the application processes may be allocated to the server computers $104_1$ to $104_{18}$ accordingly.

The steps of FIG. 5 may, but need not, be executed on a computer server management system 108 that also employs the steps of FIG. 4. The operations of FIG. 5 may be used as a part of step 310 of FIG. 3. To this end, the operations described below use load modeling to determine a most (or approximately most) efficient allocation of heat load (and consequently processing load) in the data center 102. The result of the operations of FIG. 5 identifies a best configuration ACUs to be turned on for a given thermal load TL for the overall data center 102. The computer server management system 108 may then assign or re-assign computer processing tasks among the server computers $104_1$ to $104_{18}$ in accordance with the identified ACU configuration.

Thus, in one example, the processing circuit 112 may first obtain from the BAS element 120 the current thermal load TL in the data center, based on loading of the ACUs $106_1$, $106_2$, $106_3$, $106_4$. The processing circuit 112 may then execute the operations of FIG. 5 to determine if a better allocation of the existing processing tasks can achieve a more efficient loading of the ACUs $106_1$, $106_2$, $106_3$, $106_4$.

Alternatively, the processing unit 112 may predetermine the best ACU configurations for a plurality of given thermal loads, and then store the results. Thus, the processing unit 112 may have stored in the memory 110 a plurality of data points of best (or near best) thermal load allocation among the ACUs $106_1$, $106_2$, $106_3$, $106_4$ for a plurality of data center thermal load levels. Then, from time to time, the processing circuit 112 obtains the current thermal load TL and identifies a best thermal load model based on the stored data points.

As a consequence, the operations of FIG. 5 may be generated prior to actual data center operations, such that the results are stored for future use. Alternatively, the operations of FIG. 5 may be generated in quasi-real time, in response to receipt of actual calculated thermal load TL.

In step 505, the processing circuit 112 selects a configuration of ACUs to be activated for a given overall thermal load TL for the data center 102. In step 510, the processing circuit 112 determines a load ratio of the selected ACU configuration, $LR_{comb}$, by dividing the TL value by the full loading capacity of the selected ACU configuration, $MAXL_{comb}$. In other words, $$LR_{comb} = TL/MAXL_{comb}$$

In step 515, the processing circuit 112 determines whether selected configuration is a valid combination based on the load ratio value $LR_{comb}$. For example, if the configuration cannot adequately cool the data center 102 under the conditions of thermal load TL, then selected ACU configuration is not valid. In the current embodiment, the processing circuit 112 carries out step 515 by determining if the calculated load ratio $LR_{comb}$ is between 0.3 and 1.0. If so, then the processing circuit 112 proceeds to step 520. If not, then the ACU configuration is not valid and the processing circuit 112 proceeds to step 525, discussed further below.

To reach step 520, it has been determined that the selected ACU configuration/combination is valid. In step 520, the processing circuit 112 determines the power draw for the selected ACU combination, $PD_{comb}$. To this end, the processing circuit 112 may first determine, based on the efficiency characteristics for the ACUs $106_1$, $106_2$, $106_3$, $106_4$ (e.g. curves 212, 214, 216 and 218 of FIG. 2), the best allocation of the thermal load TL among the selected combination of ACUs. Using this best allocation of the load TL among the selected ACU combination, the processing circuit 112 then calculates the overall power draw for the selected combination, $PD_{comb}$, by adding the individual predicted power draws for each of the ACUs in the selected ACU combination.

Thereafter, in step 530, the processing circuit 112 determines whether the power draw for the selected combination is lower than the current lowest power draw for all previously evaluated ACU combinations. In other words, the processing circuit 112 determines whether $PD_{comb} < PD_{bestcomb}$ wherein $PD_{bestcomb}$ is the power draw of the best combination of ACUs calculated thus far, for the current TL. If the answer in step 530 is negative, then the processing circuit 112 proceeds to step 525, discussed further below. If the answer in step 530 is positive, however, then the processing circuit 112 in step 535 stores the selected combination of ACUs as the current best combination for the load TL, and sets $PD_{bestcomb} = PD_{comb}$. The processing circuit 112 then proceeds to step 525.

In step 525, the evaluation of the selected ACU configuration/combination for the data center load level TL is complete. In step 525, the processing circuit 112 determines whether there are any other combinations of ACUs to be evaluated. If so, then the processing circuit 112 returns to step 505 to select another configuration of ACUs. If not, then the evaluation is complete, and the processing circuit 112 in step 535 stores the ACU combination associated with $PD_{bestcomb}$ as the appropriate ACU combination for the data center thermal load level TL.

The processing circuit 112 may subsequently allocate application processes such that the thermal load TL will be borne by the combination of ACUs that correspond to the $PD_{bestcomb}$. In addition, as per step 320 of FIG. 3, the processing circuit 112 informs the BAS element 120 of the combination of ACUs that should be activated based on the current thermal load TL. Alternatively, the processing circuit 112 and/or the BAS element 120 may generate an advisory message for the plant operator indicating the combination of ACUs that should be activated.

In another embodiment, a set of operations may be performed from time to time to determine whether a reallocation of application processes among the server computers $104_1$ to $104_{18}$ may allow for one of the currently operating ACUs $106_n$ to be shut down. The process involves calculating the maximum cooling capability (at an acceptable or maximum efficiency) of each online ACU unit. The total of the maximum capability from the on-line ACUs is then compared to the current actual thermal load to determine the spare capacity of the on-line ACUs. If the load of the least efficient on-line ACU drops below the spare capacity for a given time period, then the least efficient on-line ACU is shut down, and the processing tasks are reallocated among the server computers $104_1$ to $104_{18}$ accordingly.

It will be appreciated that the above described embodiments are merely illustrative, and that those of ordinary skill in the art may readily devise their own implementations and modifications that incorporate the principles of the present invention and fall within the spirit and scope thereof.

We claim:

1. A method, comprising:
   a) storing in a memory efficiency characteristic information for each of a plurality of air conditioning units in a location containing a plurality of server computers, the efficiency characteristic information including information representative of an efficiency performance curve for a range of variable cooling output; and
   b) identifying a current thermal load on each of the plurality air conditioning units;
   c) employing the stored efficiency characteristic information and the current thermal load to identify a first air conditioning unit having a least additional power consumption required to increase cooling output;
   d) employing one or more processing units to allocate one or more processing tasks to one of the plurality of server computers based on the identified first air conditioning unit.

2. The method of claim 1, wherein step d) further comprises employing the one or more processing units to allocate a first processing task to a first of the plurality of server computers based at least in part on a thermal proximity of the first of the plurality of server computers to the first air conditioning unit.

3. The method of claim 1, further comprising performing steps b) and c) responsive to receiving a processing request for the one or more processing tasks.

4. The method of claim 1, further comprising communicating processing load information corresponding to the one of the plurality of server computers to a building automation system controller.

5. The method of claim 4, further comprising using the building automation system controller to control an aspect of one or more of the air conditioning units based on the communicated processing load information.

6. A method, comprising:
   a) storing in a memory efficiency characteristic information for each of a plurality of air conditioning units in a location containing a plurality of server computers, the efficiency characteristic information including information representative of an efficiency performance curve for a range of variable cooling output;
   b) estimating heat generated by a set of one or more processing tasks;
   c) determining one or more candidate power consumption values based on the estimated heat generated, the efficiency characteristic information, and a thermal impact function for each of the plurality of server computers, each thermal impact function identifying a thermal impact on each of the plurality of air conditioning units by heat generated by the corresponding server computer; and
   d) employing one or more processing units to allocate one or more processing tasks to one of the plurality of server computers based on the candidate power consumption values.

7. The method of claim 6, wherein step c) further comprises:
   i) identifying a first proposed task allocation to a first server computer;
   ii) identifying a thermal load on the plurality of air conditioning units based on the thermal impact function corresponding the first server computer;
   iii) identifying a first candidate power consumption value based on the thermal load on the plurality of air conditioning units and the efficiency characteristic information;
   iv) identifying a second proposed task allocation to a second server computer;
   v) identifying a second thermal load on the plurality of air conditioning units based on the thermal impact function corresponding to the second server computer; and
   vi) identifying a second candidate power consumption value based on the second thermal load on the plurality of air conditioning units and the efficiency characteristic information.

8. The method of claim 7 wherein step d) further comprises:
   selecting one of the first proposed task allocation and the second proposed task allocation based on the first candidate power consumption value and the second candidate power consumption value; and
   employing the one or more processing units to allocate the one or more processing tasks to the one of the plurality of server computers based on the selected one of the first proposed task allocation and the second proposed task allocation.

9. The method of claim 7, wherein each thermal impact function of each of the plurality of server computers includes a weighting value for each of the plurality of air conditioning units.

10. The method of claim 6, wherein each thermal impact function of each of the plurality of server computers includes a weighting value for each of the plurality of air conditioning units.

11. The method of claim 6, further comprising communicating processing load information corresponding to the one of the plurality of server computers to a building automation system controller.

12. The method of claim 11, further comprising using the building automation system controller to control an aspect of one or more of the air conditioning units based on the communicated processing load information.

13. The method of claim 6, wherein the efficiency characteristic information includes information representative of a change in power consumption as a function of a change in the cooling output for an operating air conditioning unit.

14. A method, comprising:
   a) identifying a first configuration a plurality of air conditioning units to be activated in a data center for a given thermal load;
   b) determining in a processor a load ratio for the first configuration, the load ratio comprising a ratio of the given thermal load to a full load capacity of the first configuration;
   c) determining in the processor if the load ratio is within a predetermined range;
   d) determining in the processor a first power draw associated with the first configuration of the plurality of air conditioning units cooling the given thermal load;
   e) communicating information external to processor corresponding to a selection of the first configuration of the plurality of air conditioning units, the selection responsive to a determination that the first power draw is lower than other power draws associated with other configurations of the plurality of air conditioning units cooling the given thermal load, and to the determination that the load ratio is in the predetermined range.

15. The method of claim 14, further comprising, prior to step a), receiving the given thermal load from a building automation system device.

16. The method of claim 14, wherein the predetermined range has an upper limit of 1.0.

17. The method of claim 14, wherein the predetermined range has a lower limit of 0.3.

18. The method of claim 14, wherein step d) further comprises:
 i) selecting one of a plurality of allocations of the given thermal load among the first configuration of the plurality of air conditioning units based upon efficiency characteristic information for each of a plurality of air conditioning units;
 ii) determining the first power draw based on a power draw corresponding to the selected allocation.

19. The method of claim 18, wherein step i) further comprises selecting a best allocation of the plurality of allocations.

20. The method of claim 14, wherein the step of communicating information includes generating an advisory message.

\* \* \* \* \*